United States Patent
Tsuruki

[19]

[11] Patent Number: 5,886,536
[45] Date of Patent: Mar. 23, 1999

[54] SEMICONDUCTOR TESTER SYNCHRONIZED WITH EXTERNAL CLOCK

[75] Inventor: Yasutaka Tsuruki, Kazo, Japan

[73] Assignee: Advantest Corp., Tokyo, Japan

[21] Appl. No.: 793,129

[22] PCT Filed: Jul. 20, 1995

[86] PCT No.: PCT/JP95/01438

§ 371 Date: Apr. 25, 1997

§ 102(e) Date: Apr. 25, 1997

[87] PCT Pub. No.: WO97/04327

PCT Pub. Date: Feb. 6, 1997

[51] Int. Cl.[6] .................................................... G01R 23/02
[52] U.S. Cl. ........................................ 324/765; 324/158.1
[58] Field of Search ................................. 324/158.1, 73.1, 324/765, 763, 548; 371/20.4, 15.1, 25.1; 331/57, 17, 25; 438/14, 17; 257/40, 48

[56] References Cited

U.S. PATENT DOCUMENTS 5,295,079  3/1994  Wong et al. ............................ 324/73.1
5,511,126  4/1996  Westwick ................................ 324/548

FOREIGN PATENT DOCUMENTS 56-16547   4/1981  Japan .
62-11181   1/1987  Japan .
63-148176  6/1988  Japan .
7-38979    7/1995  Japan .

*Primary Examiner*—Vinh P. Nguyen
*Attorney, Agent, or Firm*—Muramatsu & Associates

[57] ABSTRACT

The present invention aims to take in an external clock signal generated by a device under test into a semiconductor tester and eliminate jitters involved in the clock signal, thereby stabilizes the clock signal, and to use the clock signal as an operation clock of the tester. Hence, a divider A11 which takes the clock signal 21 generated by the device under test as an input, a phase detector circuit 12, a loop filter 13, a VCO 14 and a divider B16 are provided. In addition, the invention includes a test rate generator 15 and an inter-leave circuit 18. The operation clock which is an output of the VCO 14 is input to the test rate generator 15 to output a test rate signal 23, and distributes the test rate signal to the inside circuits as well as feeds back to the phase detector 12 through the divider B16.

3 Claims, 3 Drawing Sheets

SEMICONDUCTOR TESTER SYNCHRONIZED WITH EXTERNAL CLOCK

TECHNICAL FIELD

This invention relates to a synchronization circuit, to be used in a semiconductor tester to receive an external clock signal, which removes jitters of the clock signal and synchronizes an internal clock signal of the semiconductor tester with the external clock signal.

BACKGROUND ART

An example of the conventional technology is represented in FIG. 3. In a semiconductor tester, an operation clock signal is generated inside the test system. Test patterns are generated in synchronism with the clock signal and applied to a semiconductor device under test. The resultant output signals from the device under test are compared with expected pattern. In such an arrangement, a problem of producing jitters does not occur since all the operation in the system is synchronized with the internal clock signal. On the other hand, there is a semiconductor device which generates a clock signal by itself. In such a case, a method may be used for utilizing the clock signal from the device itself to operate the semiconductor tester. In this method, the internal clock of the semiconductor tester has to be synchronized with the clock signal from the device under test. However, the problem of jitters will occur between the two clocks as shown in FIG. 4 since the two clocks are completely out of synchronization.

Therefore, it is an object of the present invention to solve this problem and to provide a semiconductor tester circuit which will not generate jitters when using an external clock signal.

DISCLOSURE OF THE INVENTION

According to the first embodiment of this invention, a divider is provided which receives an external clock signal generated by a semiconductor device under test at an input terminal and divides the clock signal by 1/N. A phase detector is provided which receives the output of the divider and an output of another divider. A loop filter is provided which takes the output of phase detector as an input signal. A voltage controlled oscillator (hereinafter "VCO") is provided which receives the output of the loop filter as an input. The output signal of the VCO is provided to an input of a test rate generator which provides the output of the VCO to various circuits in the semiconductor tester. A divider is provided which receives the output of the test rate generator as an input signal and divides the input signal by 1/N. The output of the divider is taken as the input of the phase detector as noted above.

According to the second embodiment of the present invention, a test signal frequency generator is provided which can set a test signal frequency in high resolution, such as 1 Hz increment. A divider is provided which receives a clock signal generated by the test signal frequency generator at an input terminal and divides the received clock signal by 1/N. A phase detector is provided which receives the output of the divider and an output of another divider. A loop filter is provided which takes the output of phase detector as an input signal. A VCO is provided which receives the output of the loop filter as an input. The output signal of the VCO is provided to an input of a test rate generator which provides the output of the VCO to various circuits in the semiconductor tester. A divider is provided which receives the output of the test rate generator as an input signal and divides the input signal by 1/N. The output of the divider is taken as the input of the phase detector as noted above.

Because of the arrangement of the embodiments of the present invention described above, a phase Locked Loop (PLL) is formed by interactions of the divider A, the phase detector, the loop filter, the VCO and the divider B. Thus, the clock signal received asynchronously can be converted to an operation clock having high stability. In other words, the present invention provides an operation clock which does not have jitter components.

BEST MODE FOR CARRYING OUT THE INVENTION

Figure 1:
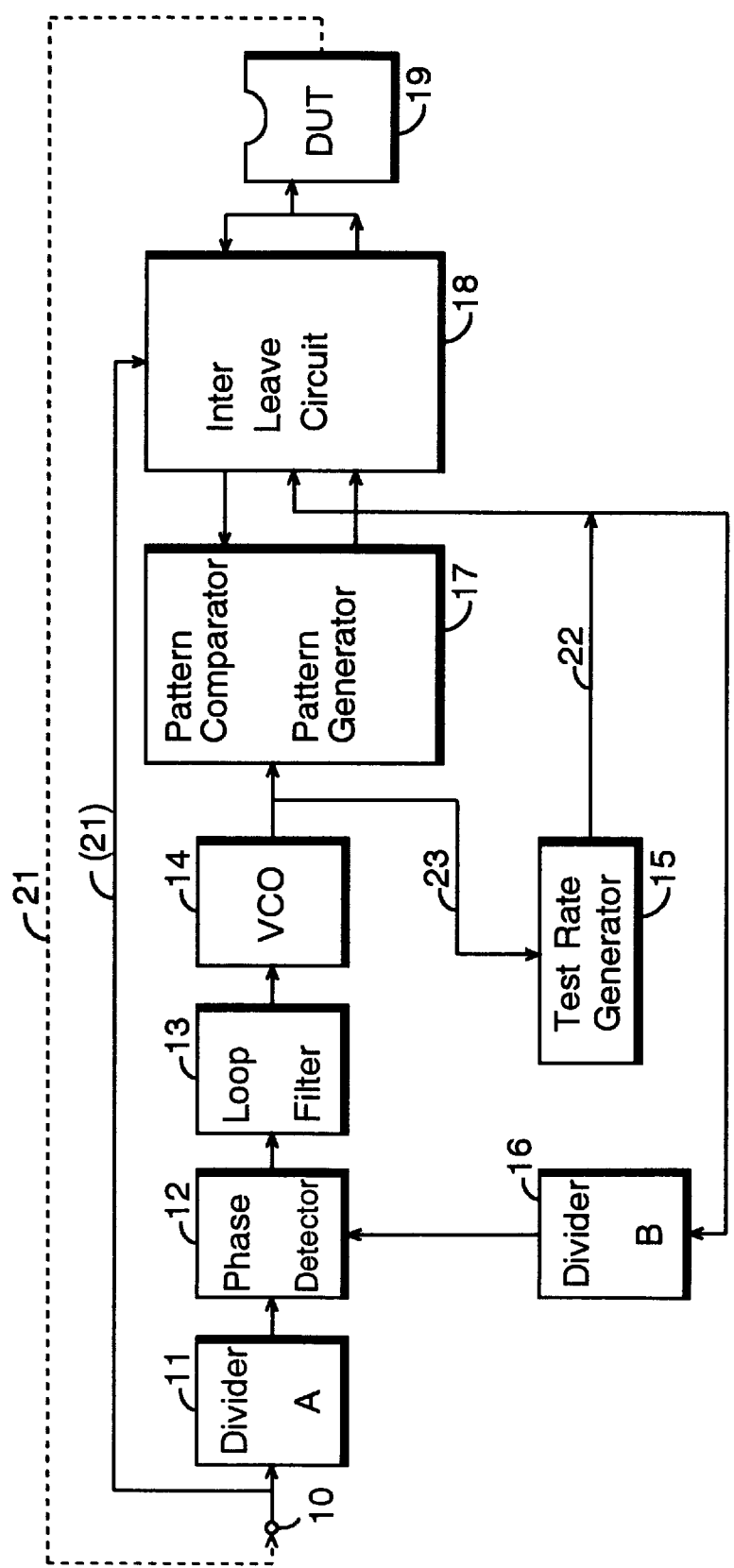
FIG. 1 is a block diagram showing the first embodiment of the present invention.
Figure 2:
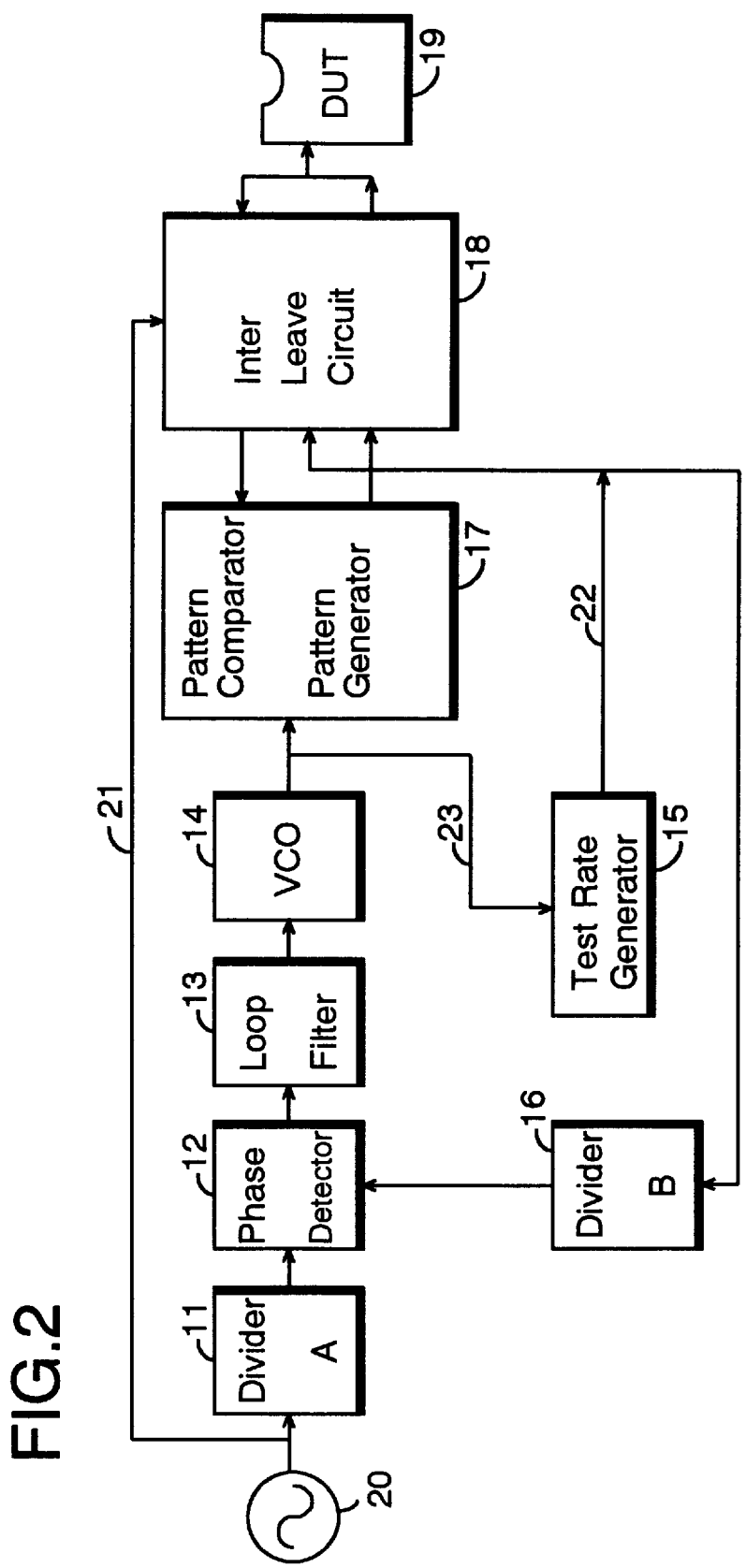
FIG. 2 is a block diagram showing the second embodiment of the present invention.
Figure 3:
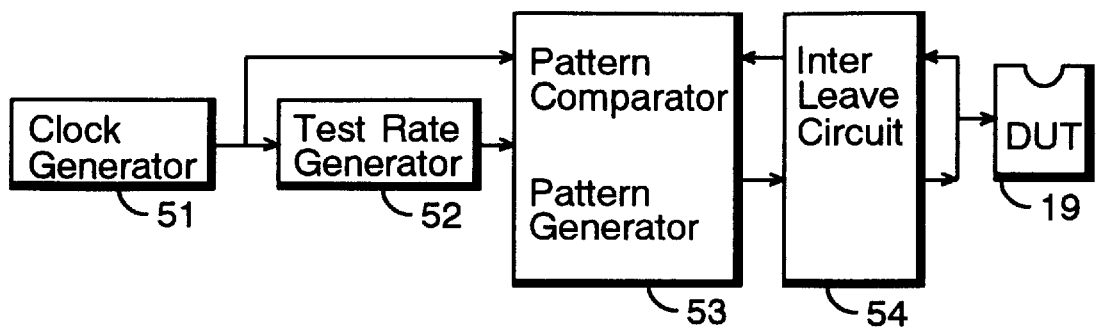
FIG. 3 is a block diagram showing the conventional technology.
Figure 4A:
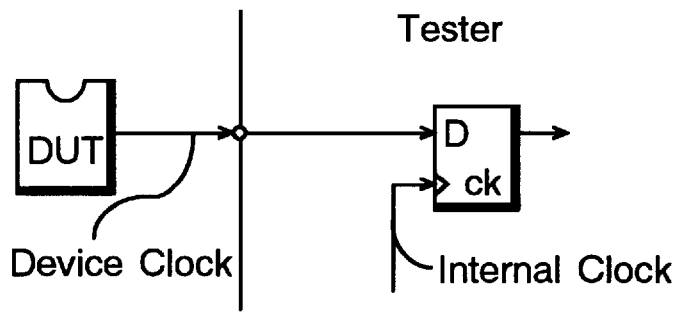
FIGS. 4A–4B are diagrams for explaining jitters.
Figure 4B:
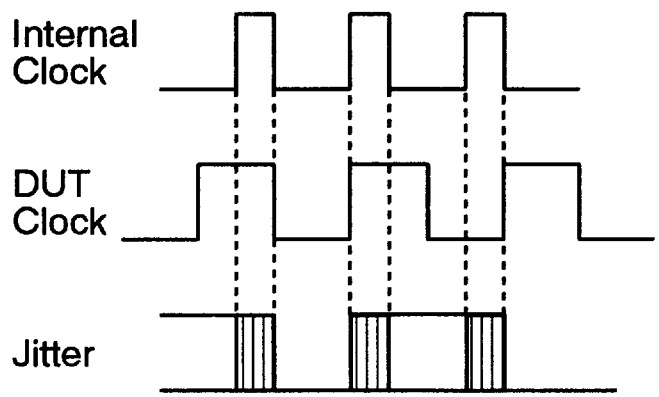

A clock period of a clock signal 21 which is provided to an input terminal 10 from a device 19 under test as shown in FIG. 1 is measured in advance by a frequency counter. The measured value of the clock period is preset in a test rate generator 15. Only the difference between the first and second embodiments is whether a means of generating the clock signal is a frequency generator 20 itself as shown in FIG. 2 or the clock signal generated by the device 19 under test as shown in FIG. 1. Hence the explanation hereafter applies to both cases. The clock signal 21 at the input of the divider A11 is also provided to an inter-leave circuit 18 as a clock signal to synchronize with inputs and outputs of the device 19 to be tested.

The frequency of the clock signal 21 which is input to the divider A11 is designated by f which is asynchronous with an internal clock of the semiconductor tester. The clock signal 21 provided to the divider A11 is divided by 1/N. Hence, the output of the divider A11 is f1=f/N. A phase detector 12 is provided which has two input terminals. One input terminal of the phase detector 12 is provided with an input signal of the frequency f1, and the other input terminal is provided with an input signal having a frequency f2. The phase detector 12 outputs the phase differences between the frequencies f1 and f2. In a loop-filter 13, this phase differences is taken as an input signal and is converted to a corresponding voltage signal. In a VCO 14, the converted voltage signal from the loop-filter 13 controls a frequency signal, and the resulted output signal is taken as an operation clock 23 for the semiconductor tester.

The test rate generator 15 generates a test rate signal 22 by taking the operation clock 23 as an input to use the test rate signal for the internal circuits in the tester. The test rate signal is also input to a divider B16 where it is divided by 1/N to produce the frequency f2 which is provide to another input terminal of the phase detector 12 as noted above. In the foregoing arrangement, a PLL circuit is formed which converts the asynchronous clock signal 21 to the stabilized operation clock 23. The inter-leave circuit 18 performs the exchange of clock signals between the test rate signal 22 and the clock signal 21, i.e., from the test rate signal 22 to the clock signal 21 or from the clock signal 21 to the test rate signal 22, to secure the signal transfer, such as applying test pattern signals to the device 19 under test or receiving the resultant signal from the device 19 under test.

The inter-leave circuit 18 also makes it possible to provide a signal which has a resolution higher than a divided clock period.

The details of the inter-leave circuit which absorbs phase differences is described in Japanese patent application No. 5-73506.

Since it is configured as described in the foregoing, the present invention has the following effects.

The present invention provides a circuit arrangement which will not produce the jitters even when an external clock signal is used. Hence the semiconductor tester can be operated by an actual operation clock of the device 19 under test. Further, in the present invention, the clock signal of high frequency resolution can be used since it is possible to set the clock signal with a small frequency increment. Thus, the present invention has significant advantages over the conventional technology.

What is claimed is:

1. A semiconductor tester synchronized with an external clock signal, comprising:

A first divider (11) which receives an external clock signal (21) from a device (19) under test;

a phase detector (12) which is provided with the output signal of the first divider (11) and an output signal from a second divider (16), and generates a frequency difference between the two output signals;

a loop filter (13) which receives the output of the phase detector (12) as an input and converts the frequency difference into a voltage signal;

a voltage controlled oscillator (14) whose frequency is controlled by the output signal of the loop filter (13);

a test rate generator (15) which is provided with the output signal of the voltage controlled oscillator (14);

said second divider (16) is provided with the output signal of the test rate generator (15);

an inter-leave circuit (18) which is provided with the output signals of the test rate generator (15) and the clock signal (21) as input clocks, and absorbs the phase differences between the two.

2. A semiconductor tester synchronized with an external clock signal, comprising:

a test frequency generator (20) which generates a clock signal;

A first divider (11) which receives an external clock signal (21) from the frequency generator (20);

a phase detector (12) which is provided with the output signal of the first divider (11) and an output signal from a second divider (16), and generates a frequency difference between the two output signals;

a loop filter (13) which receives the output of the phase detector (12) as an input and converts the frequency difference into a voltage signal;

a voltage controlled oscillator (14) whose frequency is controlled by the output signal of the loop filter (13);

a test rate generator (15) which is provided with the output signal of the voltage controlled oscillator (14);

said second divider (16) is provided with the output signal of the test rate generator (15);

an inter-leave circuit (18) which is provided with the output signal of the test rate generator (15) and the clock signal (21) as input clocks, and absorbs the phase differences between the two.

3. A semiconductor tester synchronized with an external clock signal, comprising:

A first divider (11) which receives an external clock signal (21);

a phase detector (12) which is provided with the output signal of the first divider (11) and an output signal from a second divider (16), and generates a frequency difference between the two output signals;

a loop filter (13) which receives the output of the phase detector (12) as an input and converts the frequency difference into a voltage signal;

a voltage controlled oscillator (14) whose frequency is controlled by the output signal of the loop filter (13);

a test rate generator (15) which is provided with the output signal of the voltage controlled oscillator (14) as an input;

said second divider (16) is provided with the output signal of the test rate generator (15) as an input;

an inter-leave circuit (18) which is provided with the output signals of the test rate generator (15) and the clock signal (21) as input clocks, and absorbs the phase differences between the two.

* * * * *